US012772490B2

(12) United States Patent
Amethystna et al.

(10) Patent No.: US 12,772,490 B2
(45) Date of Patent: Oct. 20, 2026

(54) LATERALLY-DIFFUSED METAL-OXIDE-SEMICONDUCTOR DEVICES WITH A FIELD PLATE

(71) Applicant: GlobalFoundries Singapore Pte. Ltd., Singapore (SG)

(72) Inventors: Surya Kris Amethystna, Singapore (SG); Guowei Zhang, Singapore (SG); Handoko Linewih, Singapore (SG); Jerry Joseph James, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 701 days.

(21) Appl. No.: 17/852,514

(22) Filed: Jun. 29, 2022

(65) Prior Publication Data

US 2024/0006529 A1 Jan. 4, 2024

(51) Int. Cl.

| | |
|---|---|
| ***H10D 30/65*** | (2025.01) |
| ***H10D 30/60*** | (2025.01) |
| ***H10D 64/00*** | (2025.01) |
| ***H10W 10/00*** | (2026.01) |
| ***H10W 10/30*** | (2026.01) |

(52) U.S. Cl.

CPC ........... *H10D 30/65* (2025.01); *H10D 30/603* (2025.01); *H10D 64/111* (2025.01); *H10W 10/031* (2026.01); *H10W 10/30* (2026.01)

(58) Field of Classification Search

CPC ...... H10D 64/20; H10D 64/251; H10D 64/62; H10D 62/10; H10D 62/124; H10D 64/111; H10D 30/0281; H10D 62/115; H10D 64/518; H10D 30/65; H10D 30/603; H10D 30/0221; H10D 84/0149; H10D 84/0186; H01L 21/761; H01L 21/76224;

(Continued)

(56) References Cited

U.S. PATENT DOCUMENTS 7,235,845 B2 6/2007 Xu et al.
7,262,476 B2 8/2007 Bude et al.

(Continued)

OTHER PUBLICATIONS

German Patent and Trademark Office; Office Action issued in German Patent Application No. 10 2023 114 070.1 on Jan. 26, 2026; 10 pages.

*Primary Examiner* — Leonard Chang
*Assistant Examiner* — Stanetta D Isaac
(74) *Attorney, Agent, or Firm* — Thompson Hine LLP; Francois Pagette

(57) ABSTRACT

Structures for a laterally-diffused metal-oxide-semiconductor device and methods of forming a structure for a laterally-diffused metal-oxide-semiconductor device. The structure comprises a semiconductor substrate including a first well, a second well positioned within the first well, a source region positioned in the first well, and a drain region positioned in the second well. The first well has a first conductivity type, and the second well, the source region, and the drain region have a second conductivity type opposite to the first conductivity type. The structure further comprises a field plate over the semiconductor substrate and a contact connecting the field plate to the drain region. The field plate is positioned to overlap with the drain region and with a portion of the second well adjacent to the drain region. The contact and the field plate comprise the same metal.

19 Claims, 6 Drawing Sheets

(58) Field of Classification Search
CPC ......... H01L 21/76807; H01L 21/76802; H01L 21/76804; H10W 10/031; H10W 10/30
See application file for complete search history.

(56) References Cited

U.S. PATENT DOCUMENTS

| | | | | |
|---|---|---|---|---|
| 8,790,966 | B2 | 7/2014 | Zhang et al. | |
| 10,964,810 | B2 | 3/2021 | Chou et al. | |
| 2013/0277741 | A1 | 10/2013 | Guowei et al. | |
| 2019/0013402 | A1* | 1/2019 | Singh | H10D 62/105 |
| 2019/0267455 | A1* | 8/2019 | Lin | H10D 62/116 |
| 2021/0074852 | A1 | 3/2021 | Ikeura et al. | |
| 2021/0119041 | A1* | 4/2021 | Ma | H10D 62/115 |
| 2021/0134964 | A1* | 5/2021 | Ho | H10D 30/603 |
| 2021/0296451 | A1 | 9/2021 | Chen et al. | |

* cited by examiner

LATERALLY-DIFFUSED METAL-OXIDE-SEMICONDUCTOR DEVICES WITH A FIELD PLATE

BACKGROUND

The invention relates generally to semiconductor devices and integrated circuit fabrication and, more specifically, to structures for a laterally-diffused metal-oxide-semiconductor device and methods of forming a structure for a laterally-diffused metal-oxide-semiconductor device.

High-voltage integrated circuits used, for example, in microwave/RF power amplifiers typically require specialized circuit technology capable of withstanding higher voltages. Laterally-diffused metal-oxide-semiconductor (LDMOS) devices, also known as extended-drain metal-oxide-semiconductor (EDMOS) devices, are designed to handle such higher voltages by incorporating additional transistor features, such as a drift well providing an extended drain, that promote the higher voltage handling capability. Laterally-diffused metal-oxide-semiconductor devices may be used, for example, for high-voltage power switching.

Improved structures for a laterally-diffused metal-oxide-semiconductor device and methods of forming a structure for a laterally-diffused metal-oxide-semiconductor device are needed.

SUMMARY

In an embodiment, a structure for a laterally-diffused metal-oxide-semiconductor device is provided. The structure comprises a semiconductor substrate including a first well, a second well positioned within the first well, a source region positioned in the first well, and a drain region positioned in the second well. The first well has a first conductivity type, and the second well, the source region, and the drain region have a second conductivity type opposite to the first conductivity type. The structure further comprises a field plate over the semiconductor substrate and a contact connecting the field plate to the drain region. The field plate is positioned to overlap with the drain region and with a portion of the second well adjacent to the drain region. The contact and the field plate comprise the same metal.

In an embodiment, a method of forming a structure for a laterally-diffused metal-oxide-semiconductor device is provided. The method comprises forming a first well in a semiconductor substrate, forming a second well positioned within the first well, forming a source region positioned in the first well, forming a drain region positioned in the second well, and forming a field plate and a contact over the semiconductor substrate. The first well has a first conductivity type, and the second well, the source region, and the drain region have a second conductivity type opposite to the first conductivity type. The field plate is positioned to overlap with the drain region and with a portion of the second well adjacent to the drain region, the contact connects the field plate to the drain region, and the contact and the field plate comprise the same metal.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
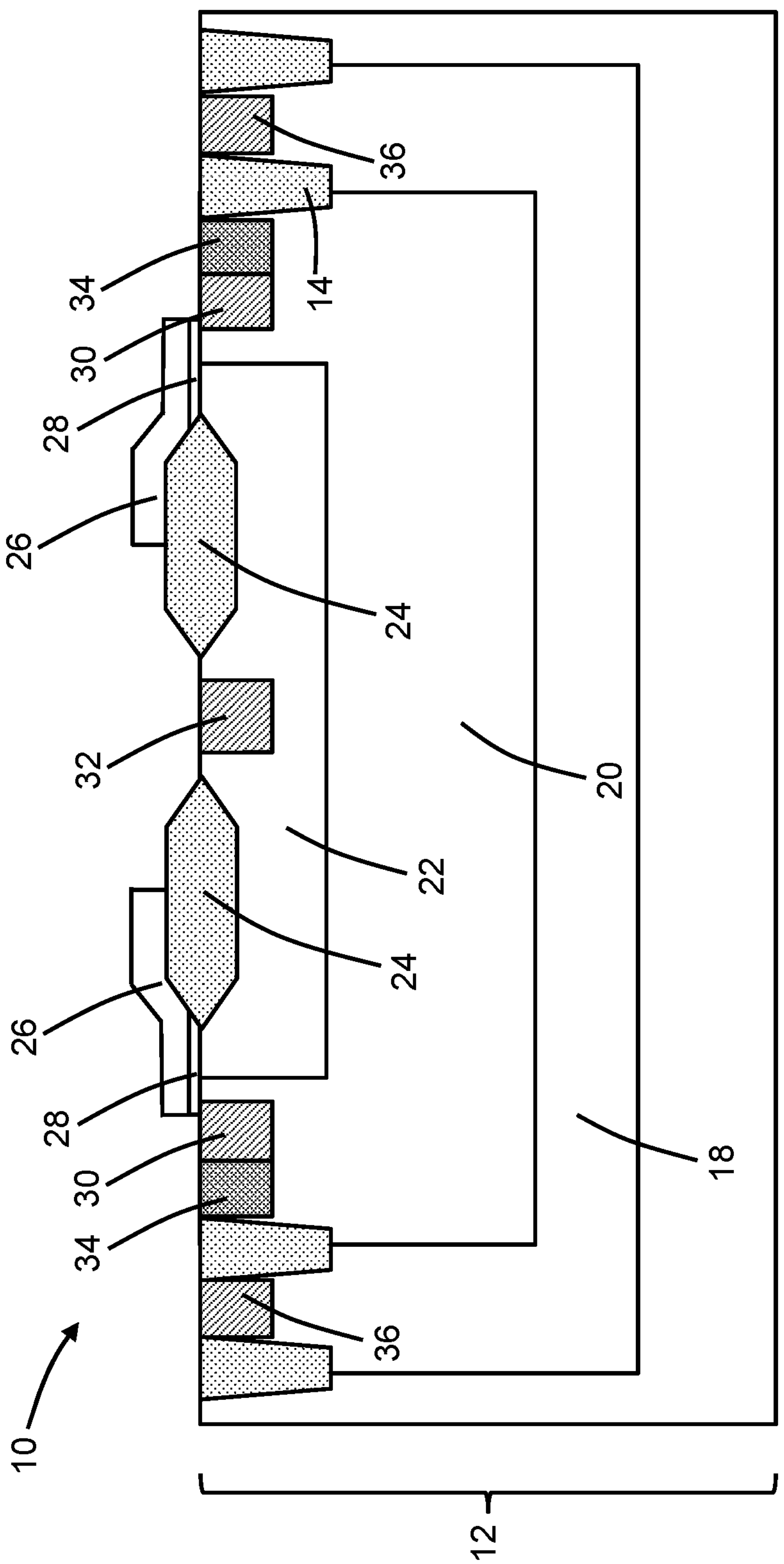
FIGS. 1-4 are cross-sectional views of a structure at successive fabrication stages of a processing method in accordance with embodiments of the invention.

With reference to FIG. 1 and in accordance with embodiments of the invention, a structure 10 for a laterally-diffused metal-oxide-semiconductor device may be formed using a semiconductor substrate 12. The semiconductor substrate 12 may be comprised of a semiconductor material, such as single-crystal silicon. In an embodiment, the semiconductor substrate 12 may have lightly-doped p-type conductivity. The semiconductor substrate 12 may include an epitaxial layer of semiconductor material epitaxially grown with a given thickness proximate to the front surface.

A shallow trench isolation region 14 is arranged in the semiconductor substrate 12 to surround an active device region. The shallow trench isolation region 14 may be formed by patterning shallow trenches in the semiconductor substrate 12 with lithography and etching processes, depositing a dielectric material to fill the shallow trenches, and planarizing and/or recessing the deposited dielectric material. The dielectric material of the shallow trench isolation region 14 may be comprised of silicon dioxide.

A well 18 is positioned in the semiconductor substrate 12. The well 18 may be formed in the semiconductor substrate 12 by introducing a dopant by, for example, ion implantation with given implantation conditions. A patterned implantation mask may be formed to define a selected area (e.g., location and horizontal dimensions) on the top surface of the semiconductor substrate 12 that is exposed for implantation to form the well 18. The implantation mask may include a layer of a photoresist having a thickness and stopping power sufficient to block implantation of ions in the masked areas. The implantation conditions (e.g., ion species, dose, kinetic energy) may be selected to tune the electrical and physical characteristics of the well 18.

The well 18 may be comprised of a region of the semiconductor material of the semiconductor substrate 12 that is doped to have an opposite conductivity type from the conductivity type of the semiconductor substrate 12. In an embodiment in which the semiconductor substrate 12 is p-type doped, the well 18 may contain semiconductor material that is doped with an n-type dopant (e.g., phosphorus and/or arsenic) to provide n-type conductivity. The well 18 may provide a high-voltage well of the laterally-diffused metal-oxide-semiconductor device.

A well 20 is positioned in the semiconductor substrate 12 and within the well 18. The well 20 may be formed in the semiconductor substrate 12 by introducing a dopant by, for example, ion implantation with given implantation conditions. A patterned implantation mask may be formed to define a selected area (e.g., location and horizontal dimensions) on the top surface of the semiconductor substrate 12 that is exposed for implantation of ions to form the well 20. The implantation mask may include a layer of a photoresist having a thickness and stopping power sufficient to block implantation of ions in the masked areas. The implantation conditions (e.g., ion species, dose, kinetic energy) may be selected to tune the electrical and physical characteristics of the well 20.

The well 20 may be comprised of a region of the semiconductor material of the semiconductor substrate 12 that is doped to have an opposite conductivity type from the well 18. In an embodiment in which the well 18 has n-type conductivity, the well 20 may contain semiconductor material that is doped with a p-type dopant (e.g., boron) to provide p-type conductivity. The well 18 surrounds a perimeter (i.e., boundary) of the well 20 on multiple sides and may adjoin the well 20 along an interface (i.e., p-n junction) across which the conductivity type changes between n-type and p-type. The well 18 electrically isolates the well 20 from the portion of the semiconductor substrate 12 surrounding the well 18.

A drift well 22 is positioned in the semiconductor substrate 12 and within the well 20. The drift well 22 may be formed in the semiconductor substrate 12 by introducing a dopant by, for example, ion implantation with given implantation conditions. A patterned implantation mask may be formed to define a selected area (e.g., location and horizontal dimensions) on the top surface of the semiconductor substrate 12 that is exposed for implantation of ions to form the drift well 22. The implantation mask may include a layer of a photoresist having a thickness and stopping power sufficient to block implantation of ions in the masked areas. The implantation conditions (e.g., ion species, dose, kinetic energy) may be selected to tune the electrical and physical characteristics of the drift well 22.

The drift well 22 may be comprised of a region of the semiconductor material of the semiconductor substrate 12 that is doped to have an opposite conductivity type from the well 20. The drift well 22 may provide a drain drift region in the laterally-diffused metal-oxide-semiconductor device. In an embodiment in which the well 20 has p-type conductivity, the drift well 22 may contain semiconductor material that is doped with an n-type dopant (e.g., arsenic or phosphorus) to provide n-type conductivity. The well 20 surrounds a perimeter (i.e., boundary) of the drift well 22 on multiple sides and may adjoin the drift well 22 along an interface (i.e., a p-n junction) across which the conductivity type changes between n-type and p-type.

Dielectric regions 24 are positioned at the top surface of the semiconductor substrate 12. Each dielectric region 24 may include a portion embedded in the semiconductor substrate 12 and a portion that projects above a top surface of the semiconductor substrate 12. In an embodiment, the dielectric regions 24 may be comprised of a dielectric material, such as silicon dioxide, that is an electrical insulator. In an embodiment, the dielectric regions 24 may be formed as a field oxide by forming a patterned hardmask and subjecting the semiconductor substrate 12 to thermal oxidation in an oxidizing atmosphere (e.g., an atmosphere with an oxygen content) using a local oxidation of silicon (LOCOS) process. The oxidizing species (e.g., oxygen) is prevented from diffusing through the thickness of the hardmask during thermal oxidation, and openings patterned in the hardmask define exposed or unprotected areas that are thermally oxidized to grow the dielectric regions 24.

Gates 26 and gate dielectric layers 28 defining a pair of gate structures are formed on the top surface of the semiconductor substrate 12. Each gate dielectric layer 28 is comprised of a dielectric material, such as silicon dioxide. Each gate 26 is comprised of a conductor, such as doped polysilicon. The gates 26 and gate dielectric layers 28 may be formed by patterning layers of their respective materials with lithography and etching processes. Each gate 26 may include a portion that overlaps with the underlying gate dielectric layer 28 and a different portion that overlaps with an underlying portion of one of the dielectric regions 24.

Source regions 30, a drain region 32, body contact regions 34, and well contact regions 36 for the laterally-diffused metal-oxide-semiconductor device are formed as separate doped regions in the semiconductor substrate 12. The source regions 30, the drain region 32, and the well contact regions 36 may be doped to have an opposite conductivity type from the body contact regions 34. The source regions 30, which are disposed in the well 20, may be doped to have an opposite conductivity type from the well 20 and may be heavily doped. The drain region 32, which is disposed in the drift well 22, may be doped to have the same conductivity type as the drift well 22 but at a higher dopant concentration (e.g., heavily doped). The body contact regions 34, which are disposed in the well 20 and may have respective abutting relationships with the source regions 30, may be doped to have the same conductivity type as the well 20. The well contact regions 36, which are disposed in the well 18, may be doped to have the same conductivity type as the well 18 but at a higher dopant concentration (e.g., heavily doped). In an embodiment in which the well 20 has p-type conductivity and the drift well 22 has n-type conductivity, the source regions 30 and the drain region 32 may be doped (e.g., heavily doped) with an n-type dopant to provide n-type conductivity (e.g., phosphorus and/or arsenic), and the body contact regions 34 may be doped (e.g., heavily doped) with a p-type dopant (e.g., boron) to provide p-type conductivity.

The source regions 30 and the drain region 32 may be formed by selectively implanting ions, such as ions including the n-type dopant, with an implantation mask defining the intended locations for the source regions 30 and the drain region 32 in the semiconductor substrate 12. The well contact regions 36 may be concurrently formed along with the source regions 30 and the drain region 32. The body contact regions 34 may be formed by selectively implanting ions, such as ions including the p-type dopant, with a different implantation mask defining the intended locations for the body contact regions 34 in the semiconductor substrate 12.

Figure 2:
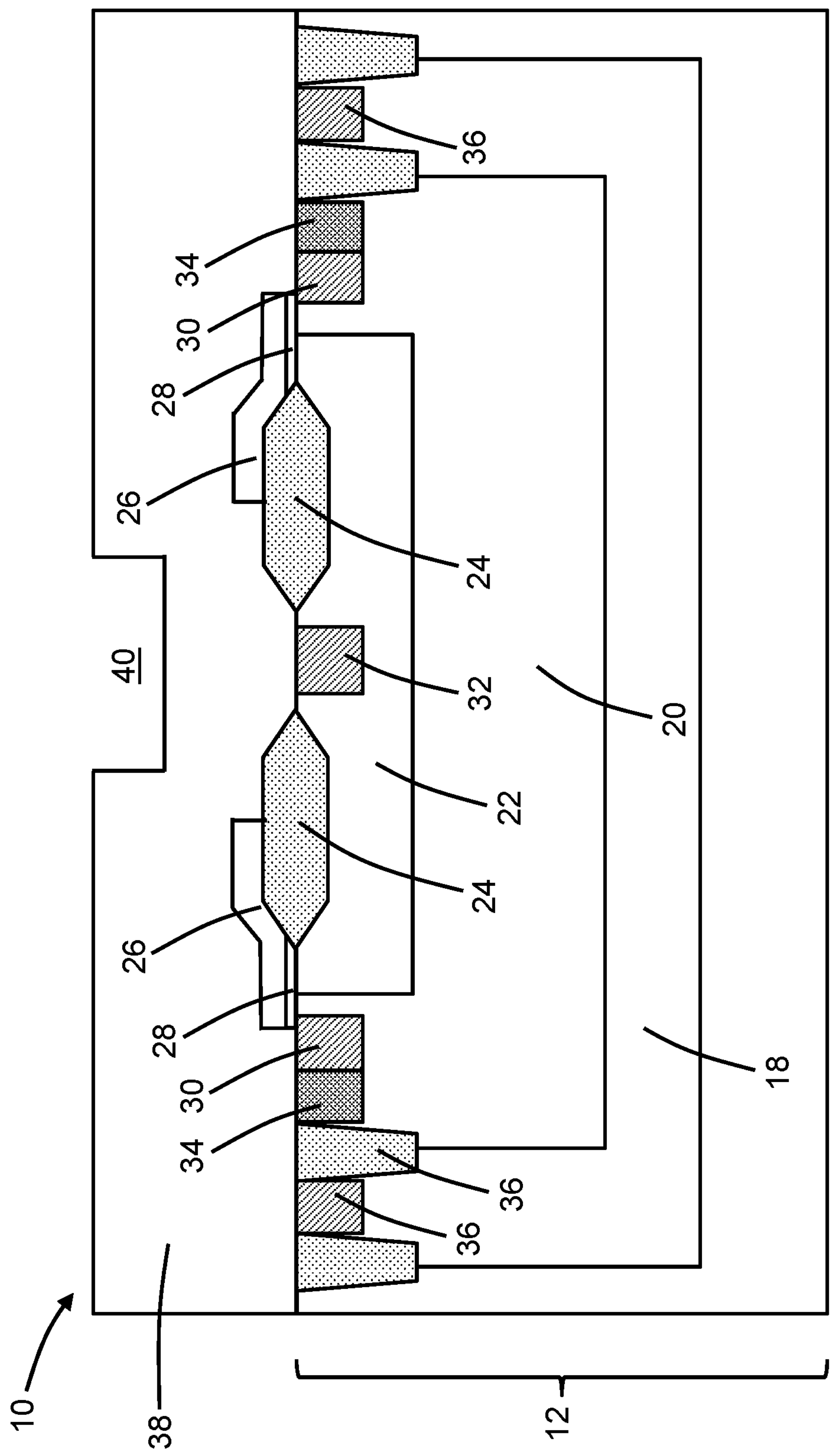

With reference to FIG. 2 in which like reference numerals refer to like features in FIG. 1 and at a subsequent fabrication stage, a dielectric layer 38 is formed over the semiconductor substrate 12. The dielectric layer 38 may be comprised of a dielectric material, such as silicon dioxide, that is an electrical insulator. The dielectric layer 38 may be deposited and then planarized by chemical-mechanical polishing to eliminate topography.

A trench 40 is patterned in the dielectric layer 38 by lithography and etching processes. The trench 40, which extends partially through the dielectric layer 38, is positioned above the drain region 32 and portions of the well 22 between the dielectric regions 24 and the drain region 32. In an embodiment, the trench 40 may also be positioned above side edge portions of the dielectric regions 24. In an embodiment, the trench 40 may be centered above the drain region 32. In an embodiment, the trench 40 may be symmetrical about the drain region 32. In an embodiment, the trench 40 may be centered above the drain region 32 and symmetrical about the drain region 32. A portion of the dielectric material of the dielectric layer 38 is positioned in a vertical direction between the bottom of the trench 40 and the top surface of the semiconductor substrate 12.

Figure 3:
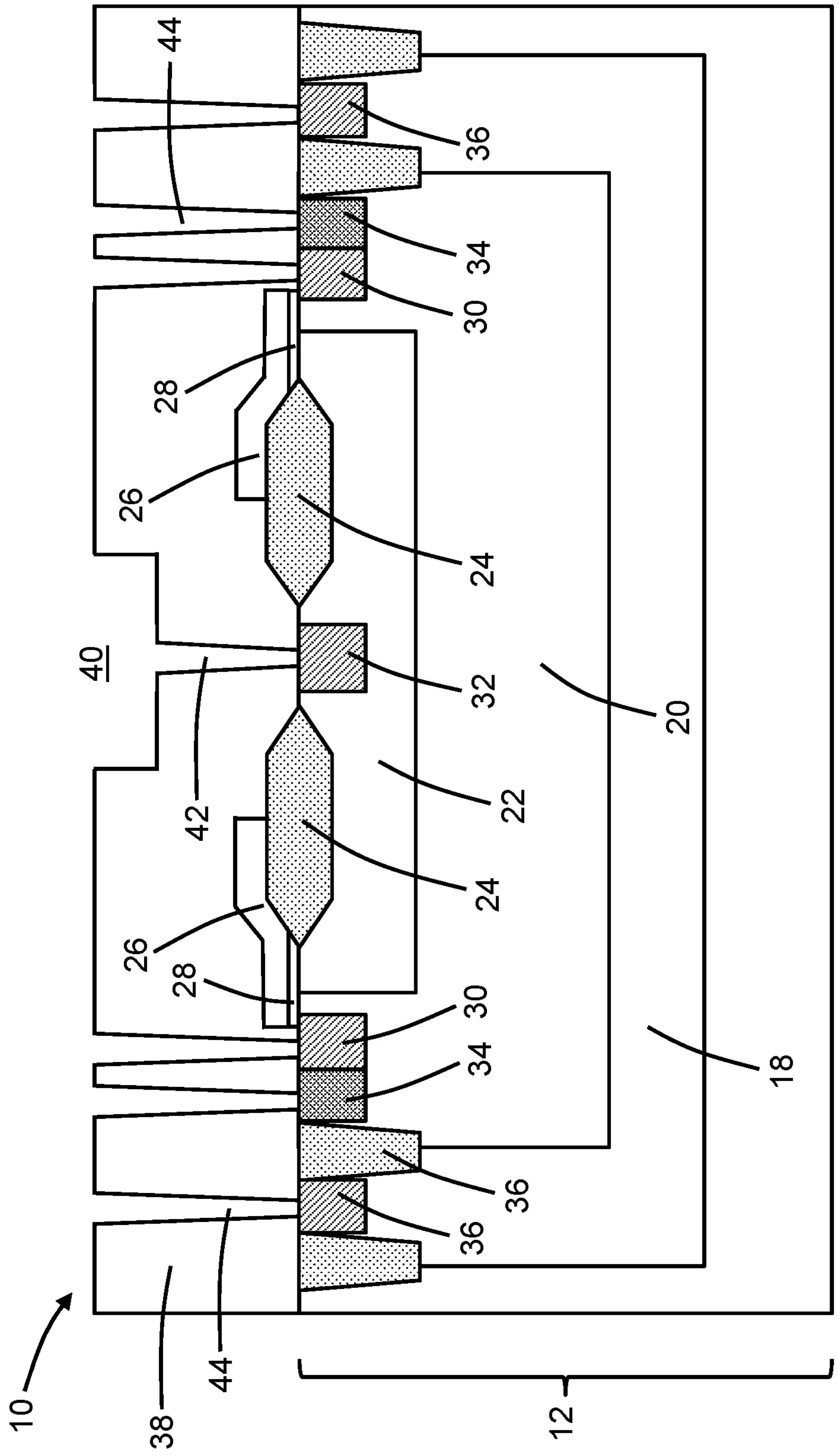

With reference to FIG. 3 in which like reference numerals refer to like features in FIG. 2 and at a subsequent fabrication stage, contact openings 42, 44 are patterned in the dielectric layer 38 by lithography and etching processes. The contact opening 42 extends fully through the partial thickness of the dielectric layer 38 at the location of the bottom of the trench 40 to the drain region 32. In an embodiment, the trench 40 may be centered about the contact opening 42. The contact openings 44 extend fully through the thickness of the dielectric layer 38 to the source regions 30, the body contact regions 34, and the well contact regions 36.

Figure 4:
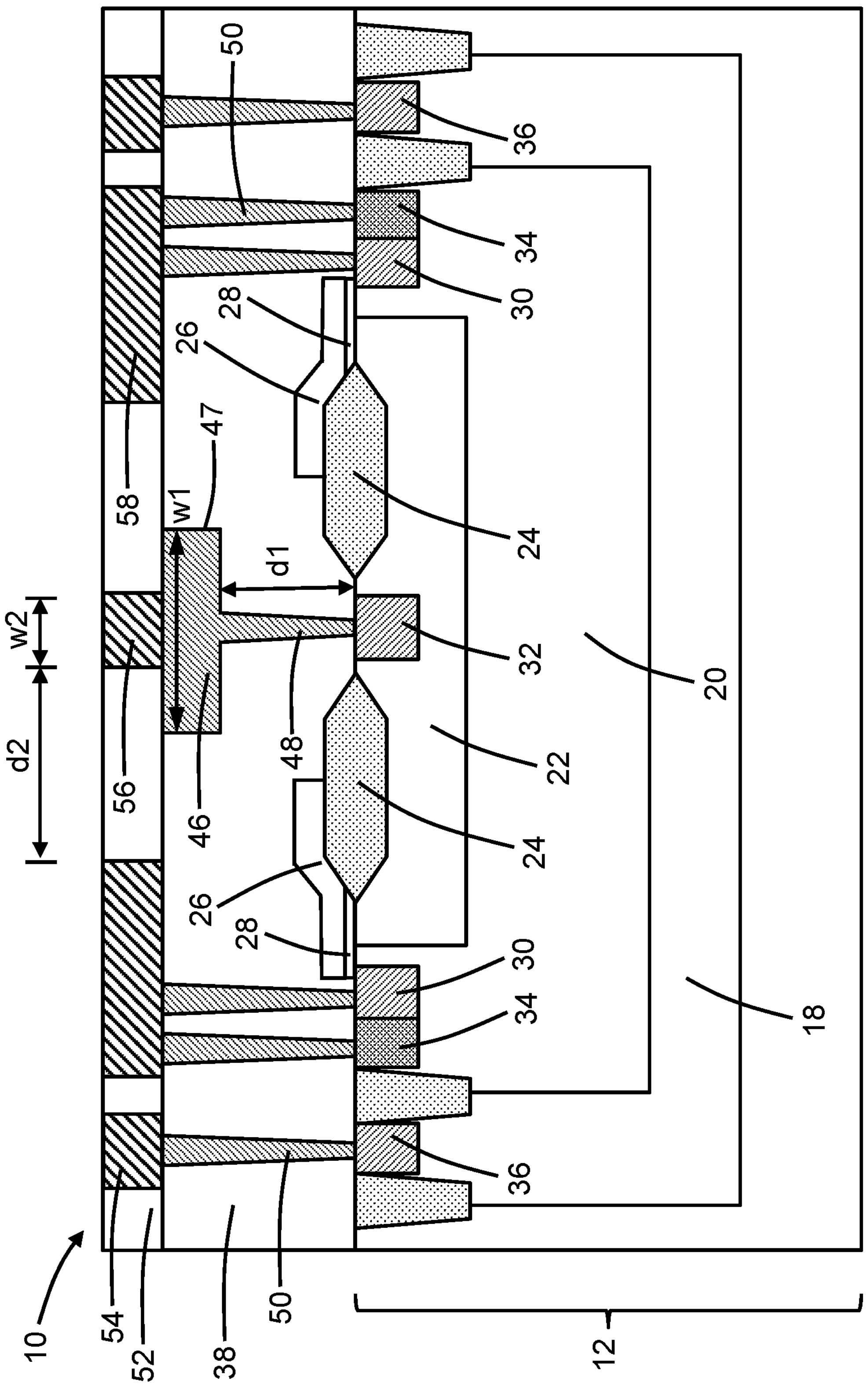

With reference to FIG. 4 in which like reference numerals refer to like features in FIG. 3 and at a subsequent fabrication stage, the trench 40 and contact openings 42, 44 in the dielectric layer 38 are filled with a metal to define a field plate 46 inside the trench 40, a contact 48 inside the contact opening 42, and contacts 50 inside the contact openings 44. Silicide may be formed initially on the areas of the source regions 30, the drain region 32, the body contact regions 34, and the well contact regions 36 exposed at the bottom of the contact openings 42, 44. The metal forming the field plate 46 and contacts 48, 50 may be deposited by, for example, chemical vapor deposition and planarized by chemical-mechanical polishing. The field plate 46 and the contacts 48, 50 are comprised of the same metal. In an embodiment, the metal may be tungsten. In an embodiment, the field plate 46 and the contacts 48, 50 may be exclusively comprised of tungsten. In an alternative embodiment, the metal may be cobalt. In an alternative embodiment, the metal may be tantalum.

Figure 5:
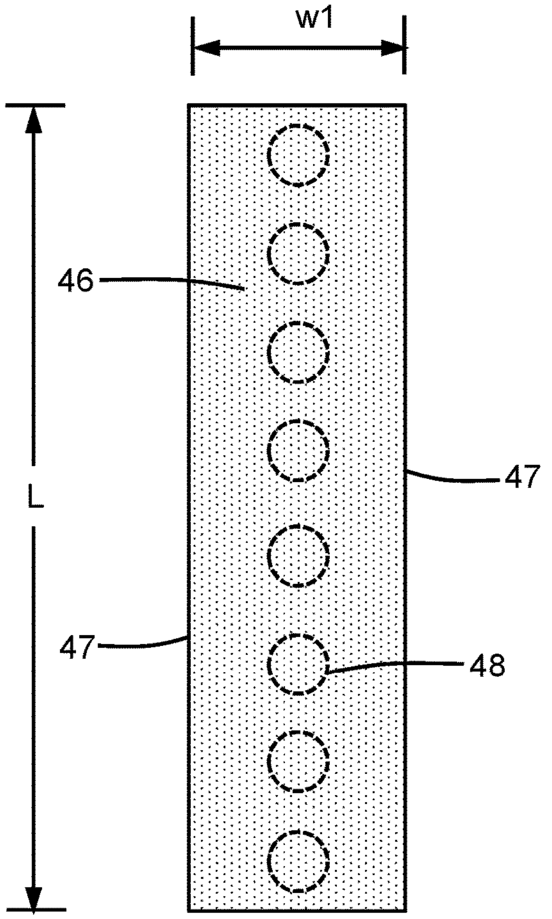
FIGS. 5 and 5A are diagrammatic top views of field plates in accordance with embodiments of the invention.
Figure 5A:
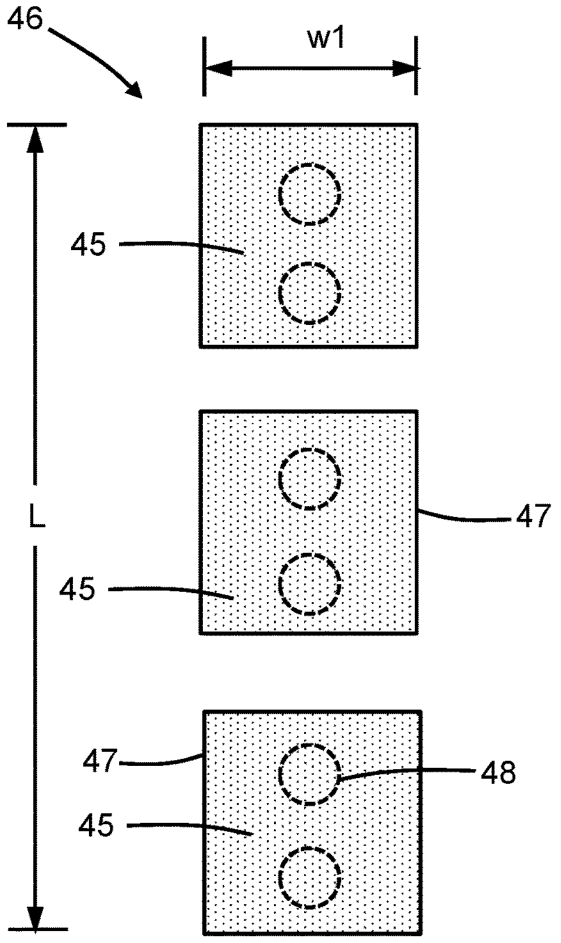

The field plate 46 has a lower surface, which is adjacent to the drain region 32, that is coupled by the contact 48 to the drain region 32. The field plate 46 is spaced in a vertical direction from the drain region 32 by a distance d1, which may be equal or substantially equal to the height of the contact 48. The field plate 46 and contact 48, which are stacked to collectively define an T-shaped feature, may comprise a single piece of metal and may adjoin without a boundary or seam. The field plate 46 extends laterally relative to the contact 48 to overlap with respective portions of the drift well 22 between the drain region 32 and the dielectric regions 24. In an embodiment, the field plate 46 may also extend laterally to overlap with respective side-edge portions of the dielectric regions 24. In an embodiment, the field plate 46 may extend longitudinally over the drain region 32 as shown in FIG. 5. In an alternative embodiment, the field plate 46 may extend longitudinally over the drain region 32 with segmentation as shown in FIG. 5A. The field plate 46 has a width w1 between opposite side edges 47 and a length L (FIGS. 5, 5A) in a direction transverse to the width w1. In an embodiment, the field plate 46 may be centered above the drain region 32. In an embodiment, the field plate 46 may be symmetrical about the drain region 32. In an embodiment, the field plate 46 may be centered above the drain region 32 and symmetrical about the drain region 32.

One or more dielectric layers 52 are formed over the dielectric layer 38. Interconnects 54, 56, 58 are formed as conductive lines in the one or more dielectric layers 52. The interconnects 54, 56, 58 are comprised of a different metal than the field plate 46 and the contacts 48, 50, and the interconnects 54, 56, 58 are formed subsequent to the formation of the field plate 46 and the contacts 48, 50. The interconnects 54, 56, 58 may be comprised of a metal, such as copper or aluminum. The interconnect 56 is coupled to the field plate 46, which is coupled by the contact 48 to the drain region 32. The interconnect 56 has a width w2 and a length in a direction transverse to the width w2, and the width w2 is less than the width w1 of the field plate 46. In an embodiment, the interconnect 56 may directly contact the field plate 46. The field plate 46 and contact 48 are positioned in a vertical direction between the interconnect 56 and the drain region 32, and the field plate 46 is positioned in a vertical direction closer to the drain region 32 than the interconnect 56. In an embodiment, the field plate 46 may project in a lateral direction from beneath opposite side edges of the interconnect 56 toward the adjacent interconnects 58. In an embodiment, the interconnect 56 may be centered above field plate 46. The interconnects 58 are coupled by contacts 50 to the source regions 30. Each of the interconnects 58 is spaced in a lateral direction from the interconnect 56 by a distance d2.

The field plate 46 may be effective to assist with the suppression of second-order substrate currents and to decrease the total parasitic capacitance. The introduction of the field plate 46 permits the width w2 of the interconnect 56 to be minimized and the distance d2 to be maximized in order to reduce the parasitic capacitance between the interconnect 56 and the interconnects 58 and the parasitic capacitance between the interconnect 56 and the gates 26. The field plate 46 may also assist with reducing current crowding at the corners of the dielectric regions 24 adjacent to the drain region 32. The field plate 46 may increase the safe operating area of the laterally-diffused metal-oxide-semiconductor device, and the field plate 46 may also operate to increase stability and reliability during high-current operation.

With reference to FIG. 5 and in accordance with embodiments of the invention, the field plate 46 may be elongated with contacts 48 that are spaced along the length of the field plate 46. Each contact 48 is coupled to a different portion of the drain region 32. The field plate 46 has a length L in a direction transverse to the width w1 and a longitudinal axis extending along the length. The interconnect 56 may extend longitudinally across the top surface of the field plate 46 parallel to the length L of the field plate 46.

With reference to FIG. 5A and in accordance with embodiments of the invention, the field plate 46 may be divided into segments 45 that are longitudinally distributed in a spaced-apart relationship along the length L of the field plate 46. Each segment 45 may be coupled by one or more contacts 48 with the drain region 32. The gaps between adjacent segments 45 may be filled by the dielectric material of the dielectric layer 38. The interconnect 56 may extend without segmentation longitudinally across the top surface of the field plate 46 parallel to the length L of the field plate 46.

Figure 6:
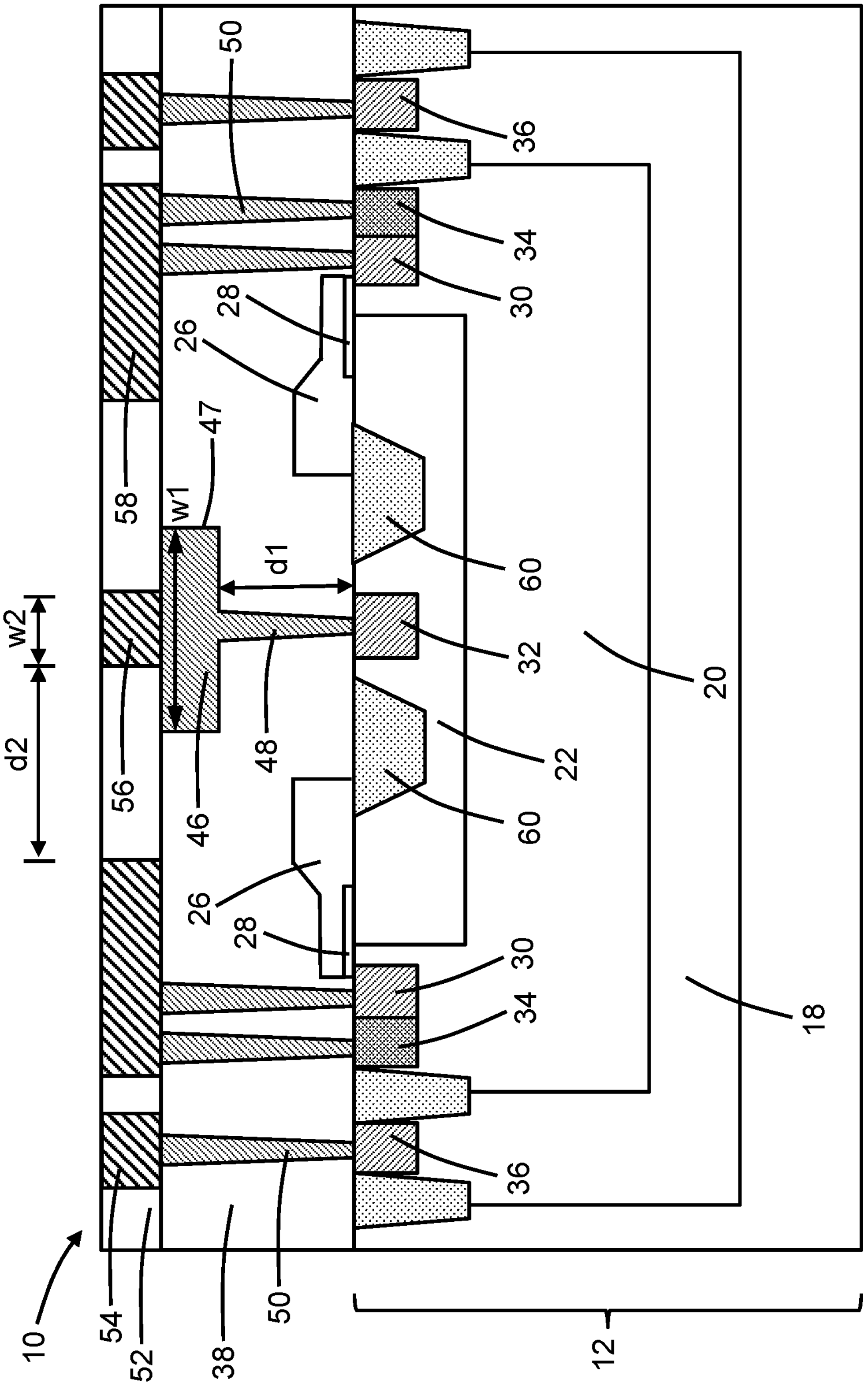
FIG. 6 is a cross-sectional view of a structure in accordance with alternative embodiments of the invention.

With reference to FIG. 6 and in accordance with alternative embodiments of the invention, shallow trench isolation regions 60 may replace the dielectric regions 24. The shallow trench isolation regions 60 may be comprised of a dielectric material, such as silicon dioxide, that is an electrical insulator. The shallow trench isolation regions 60 may be concurrently formed with the shallow trench isolation regions 14. The field plate 46 extends laterally relative to the contact 48 to overlap with respective portions of the drift well 22 between the source region 32 and the shallow trench isolation regions 60. In an embodiment, the field plate 46 may overlap with respective portions of the shallow trench isolation regions 60. In an alternative embodiment, the dielectric regions 24 may be replaced by sections of silicide-blocking layer that are positioned on the top surface of the semiconductor substrate 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor device, the structure comprising:

a semiconductor substrate including a first well and a second well positioned within the first well, the second well having a perimeter, the first well surrounding the perimeter of the second well on a plurality of sides, the first well having a first conductivity type, the second well having a second conductivity type opposite to the first conductivity type, and the first well and the second well adjoining along a p-n junction;

a source region positioned in the first well, the source region having the second conductivity type;

a drain region positioned in the second well, the drain region having the second conductivity type;

a field plate over the semiconductor substrate, the field plate positioned to overlap with the drain region and with a portion of the second well adjacent to the drain region, and the field plate comprising a first metal; and a contact directly connected to the drain region, the contact coupling the field plate to the drain region, and the contact comprising the first metal.

2. The structure of claim 1 wherein the first metal is tungsten.

3. The structure of claim 1 wherein the first metal is tungsten, and the contact and the field plate exclusively comprise tungsten.

4. The structure of claim 1 wherein the field plate includes a plurality of segments that are arranged with a spaced-apart relationship.

5. The structure of claim 4 wherein the field plate has a length, and the plurality of segments of the field plate are longitudinally distributed in the spaced-apart relationship along the length of the field plate.

6. The structure of claim 1 wherein the field plate extends in a lateral direction from the drain region toward the source region.

7. The structure of claim 1 further comprising:

a dielectric region in the semiconductor substrate, the dielectric region positioned in a lateral direction between the drain region and the source region, and the field plate overlapping with a portion of the second well arranged between the dielectric region and the drain region.

8. The structure of claim 7 further comprising:

a gate positioned in the lateral direction between the source region and the drain region, the gate having an overlapping relationship with a portion of the dielectric region.

9. The structure of claim 1 wherein the field plate is centered over the drain region.

10. The structure of claim 1 further comprising:

a first dielectric layer on the semiconductor substrate, wherein the contact and the field plate are positioned in the first dielectric layer.

11. The structure of claim 10 further comprising:

a second dielectric layer on the first dielectric layer; and an interconnect in the second dielectric layer, the interconnect arranged over the field plate.

12. The structure of claim 11 wherein the interconnect comprises a second metal different from the first metal.

13. The structure of claim 12 wherein the first metal is tungsten, and the second metal is copper or aluminum.

14. The structure of claim 11 wherein the field plate has a first width and a length transverse to the first width, and the interconnect has a second width that is less than the first width.

15. A structure for a laterally-diffused metal-oxide-semiconductor device, the structure comprising:

a semiconductor substrate including a first well and a second well positioned within the first well, the second well having a perimeter, the first well surrounding the perimeter of the second well on a plurality of sides, the first well having a first conductivity type, the second well having a second conductivity type opposite to the first conductivity type, and the first well and the second well adjoining along a p-n junction;

a source region positioned in the first well, the source region having the second conductivity type;

a drain region positioned in the second well, the drain region having the second conductivity type;

a field plate over the semiconductor substrate, the field plate positioned to overlap with the drain region and with a portion of the second well adjacent to the drain region, and the field plate comprising a first metal;

a contact connecting the field plate to the drain region, the contact comprising the first metal; and an interconnect coupled to the field plate, the interconnect comprising a second metal different from the first metal, wherein the field plate has a length and a first width transverse to the length, and the interconnect has a second width that is less than the first width.

16. The structure of claim 15 wherein the first metal is tungsten, and the second metal is copper or aluminum.

17. The structure of claim 15 wherein the field plate is positioned in a vertical direction between the interconnect and the drain region.

18. The structure of claim 15 wherein the interconnect is in direct contact with the field plate.

19. The structure of claim 15 wherein the field plate has a length, and the field plate includes a plurality of segments that are longitudinally distributed in a spaced-apart relationship along the length of the field plate.

* * * * *